(12) United States Patent
Liao (10) Patent No.: US 7,388,444 B2
(45) Date of Patent: Jun. 17, 2008

(54) SWITCHING REGULATOR DUTY CYCLE CONTROL IN A FIXED FREQUENCY OPERATION

(75) Inventor: Chiawei Liao, San Jose, CA (US)

(73) Assignee: Linear Technology Corporation, Milpitas, CA (US)

( * ) Notice: Subject to any disclaimer, the term of this patent is extended or adjusted under 35 U.S.C. 154(b) by 130 days.

(21) Appl. No.: 11/242,095

(22) Filed: Oct. 3, 2005

(65) Prior Publication Data
US 2007/0075790 A1  Apr. 5, 2007

(51) Int. Cl.
*H03K 3/02* (2006.01)
*G05F 1/00* (2006.01)

(52) U.S. Cl. ............... 331/143; 331/111; 331/150; 323/282; 323/288

(58) Field of Classification Search ........... 331/111, 331/143, 150, 153; 327/173, 174, 175; 323/242, 323/265, 282, 288
See application file for complete search history.

(56) References Cited

U.S. PATENT DOCUMENTS

| | | | |
|---|---|---|---|
| 3,571,697 A | 3/1971 | Phillips | |
| 3,579,091 A | 5/1971 | Clarke et al. | |
| 3,585,491 A | 6/1971 | Petersen | |
| 3,772,588 A | 11/1973 | Kelly et al. | |
| 3,879,647 A | 4/1975 | Hamilton et al. | |
| 3,978,393 A | 8/1976 | Wisner et al. | |
| 4,479,174 A | 10/1984 | Cates | |
| 4,541,041 A | 9/1985 | Park et al. | |
| 4,578,630 A | 3/1986 | Grosch | |
| 4,634,956 A | 1/1987 | Davis et al. | |
| 4,672,303 A | 6/1987 | Newton | |
| 4,683,529 A | 7/1987 | Bucher, II | |
| 4,814,684 A | 3/1989 | McCurdy | |
| 4,819,122 A | 4/1989 | Gontowski, Jr. | |
| 4,928,200 A | 5/1990 | Redl et al. | |
| 4,929,882 A | 5/1990 | Szepesi | |
| 5,498,995 A | 3/1996 | Szepesi et al. | |
| 5,572,158 A * | 11/1996 | Lee et al. | 327/175 |
| 5,705,919 A * | 1/1998 | Wilcox | 323/282 |
| 5,710,697 A | 1/1998 | Cooke et al. | |
| 6,198,265 B1 | 3/2001 | Stevenson | |
| 6,262,542 B1 | 7/2001 | Kim et al. | |

(Continued)

OTHER PUBLICATIONS

Sax, H.: "100 W IM Dil-Gehause" Elektronik, Weka Fachzeitschriftenverlag, Poing, DE, vol. 38, No. 10, May 12, 1989, pp. 52-54.

(Continued)

*Primary Examiner*—Robert J. Pascal
*Assistant Examiner*—Ryan J. Johnson
(74) *Attorney, Agent, or Firm*—McDermott Will & Emery LLP (57) ABSTRACT

A clock oscillator system for use in providing the switching regulator duty cycle control in a fixed frequency (no cycle skipping) operation is provided. In one embodiment, the circuit according to the invention uses an analog feedback loop to extend the switch ON time of the clock cycle by controlling the oscillator charging current and, thereby, increase the duty cycle. Preferably, this circuit can achieve very high switching duty cycle and/or very low switching duty cycle in a PWM switching regulator operated in very low drop-out operation when very high duty cycle is required or in other conditions when very low duty cycle is required.

20 Claims, 8 Drawing Sheets

U.S. PATENT DOCUMENTS

| | | |
|---|---|---|
| 6,366,070 B1 | 4/2002 | Cooke et al. |
| 6,580,258 B2 | 6/2003 | Wilcox et al. |
| 2004/0075462 A1* | 4/2004 | Kizer et al. .................. 326/29 |

OTHER PUBLICATIONS

Brown, Marty, "Practical Switching Power Supply Design," pp. 20-34, Academic Press, Inc., 1990.
Fisher, R. A. et al., "Performance of Low Loss Synchronous Rectifiers in a Series-Parallel Resonant DC-DC Converter," Proceedings of the Fourth Annual IEEE Applied Power Electronics Conference and Exposition, pp. 240-246, Mar. 1989.
Gontowski et al., "Advanced New Integrated Circuits For Current-Mode Control," Proceedings of the Power Electronics Show and Conference, pp. 341-352, Oct. 1986.
Goodenough, Frank, "Low-Voltage Analog ICs Wait in the Wings," Electronic Design, Sep. 3, 1992.
Grant, Duncan A. et al., "Power Mosfets, Theory and Application," pp. 239-256, Wiley-Interscience, 1989.
Linear Technology, Williams, J., Application Note 35, "Step Down Switching Regulators," 1990 Linear Applications Handbook, pp. AN35-1 to AN35-32, Aug. 1989.
Linear Technology, "LT1846/1847, LT3846/3847 Current Mode PWM Controller," Datasheet, 1990.
Linear Technology, "LT1524/LT3524 Regulating Pulse Width Modulator," 1990.
Micro Linear Corporation, "ML4873 Battery Power Control IC," Advance Information Data Sheet, Mar. 15, 1993, pp. 1-8.
Micro Linear Corporation, "ML4862 Battery Power Control IC," Datasheet, Mar. 1997.
Micro Linear Corporation, "ML4873 Battery Power Control IC," Datasheet, Jan. 1997 (preliminary version Mar. 1993—cited above).
Myers, R. and Peck, R., "200-kHz Power FET Technology in New Modular Power Supplies," Hewlett-Packard Journal, Aug. 1981.
National Semiconductor Corporation, "LM1578/LM2578/LM3578 Switching Regulator," Preliminary Datasheet, 1987.
Siliconix, "Si91XX Synchronous Buck Controller," Objective Specification, Dec. 20, 1990.
Siliconix, "Siliconix Si9110/Si9111," Datasheet, Oct. 1987.
Siliconix, "Si9150CY/BCY Synchronous Buck Converter Controller," Preliminary Data Sheet, Oct. 8,1992.
Siliconix, "Si9150 Synchronous Buck Regulator Controller, S-42677, Rev. D," Datasheet, Feb. 14, 1995.
Siliconix, "High-Efficiency Buck Converter for Notebook Computers," Application Note AN92-4, Date Unknown.
Siliconix, "Designing DC/DC Converters with the Si9110 Switchmode Controller," Siliconix Power Products Data Book, 1991.
Taylor, "Flyback Converter," Electronic Engineering, p. 23, Jul. 1976.
Unitrode, "UC1846/7, UC2846/7, UC3846/7 Current Mode PWM Controller," Datasheet, dated Jan. 1997 (date of first publication unknown).
Unitrode, "UC1895, UC2895, UC3895 Synchronous Rectifier Buck PWM Controller," Advance Information Datasheet, Oct. 6, 1992.
Williams, J. and Dendinger, S., "Simplify feedback controllers with a 2-quadrant PWM IC," EDN, May 26, 1983.
Williams, J., "Micropower circuits assist low-current signal conditioning," EDN, Aug. 6, 1987.
Williams, J., "Basic Principles and Ingenious Circuits Yield Stout Switchers," EDN, Jan. 18, 1990.
Siliconix, "Si9150 Synchronous Buck Converter Controller," Objective Specification, handwritten pp. 7-17, Sep. 10, 1991.

* cited by examiner

SWITCHING REGULATOR DUTY CYCLE CONTROL IN A FIXED FREQUENCY OPERATION

BACKGROUND OF THE INVENTION

This invention relates to voltage regulators. In particular, this invention relates to switch-mode voltage regulators.

Switch-mode regulators, or switching regulators as they are commonly known, are typically used as voltage regulators because they exhibit higher efficiency than an equivalent linear regulator circuit at heavy loads. A typical switching regulator operates by repeatedly turning a power switch fully on and then fully off, generating a pulse-width modulated signal that is averaged to the final voltage with an inductor.

For simplicity, the present invention is particularly described in a step-down converter embodiment. Nevertheless, the invention is not limited to this particular embodiment and, in fact, may be implemented on any suitable switching regulator. The basic invention, as well as alternative implementations of the invention, will be discussed in more detail below.

Figure 1:
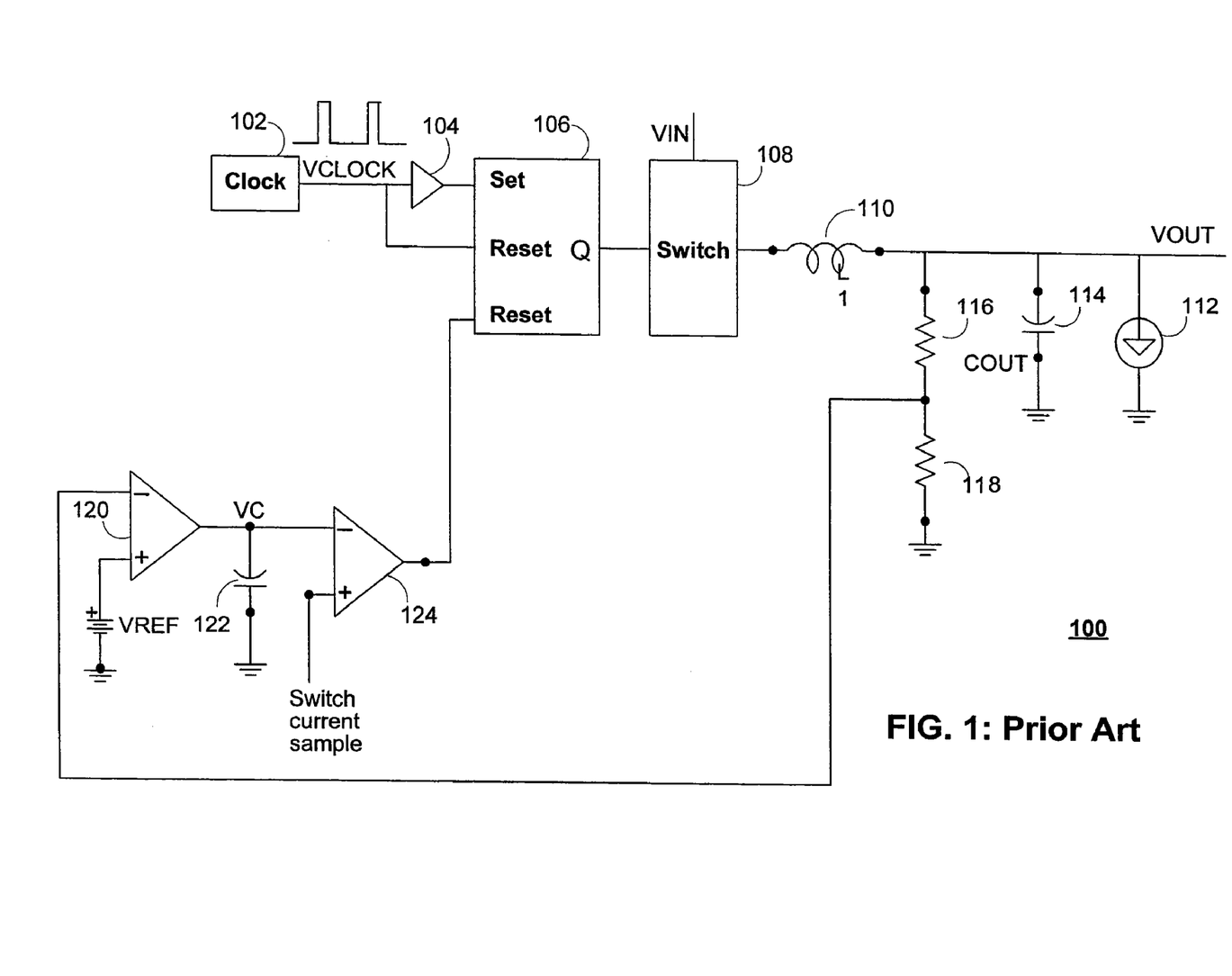
FIG. 1 shows a conventional switching regulator system 100.

FIG. 1 shows a basic, conventional switching regulator system 100. FIG. 1 includes an oscillated clock 102 of a pulse-width modulated (PWM) system, an inverter 104, a flip-flop 106, a switch 108, an inductor 110, a current source 112, an output capacitor 114, a resistor divider 116 and 118, a voltage feedback amplifier 120 (or any suitable amplifier), a feedback capacitor 122, and a current comparator 124 (or any other suitable comparator). It should be noted that inverter 104 preferably causes the PWM switch to turn ON coincident with the end of the ON cycle of clock 102. At least in this respect, the clock and the PWM switch are preferably out of phase with one another.

In general, a switching regulator generates an output voltage proportional to the input voltage, with the proportionality set by the duty cycle of the pulse width signal at the power switch. Accordingly, the switch duty cycle (the percentage of the total switching cycle that the power switch is ON) of a PWM step-down voltage regulator is determined by:

d=VOUT/VIN wherein:

d is duty cycle;

VOUT is the regulator output voltage; and

VIN is the regulator input voltage.

As the input voltage of the power supply system becomes smaller—e.g., when a battery's voltage drops as a result of usage of the battery—, the switching regulator is forced to operate at a very high clock cycle rate to maintain a substantially constant VOUT. As the clock cycle rate increases, and, consequently, the clock cycle time decreases, it becomes difficult to achieve a very high and/or a very low switch-ON duty cycle as operating conditions may at times require.

Figure 2A:
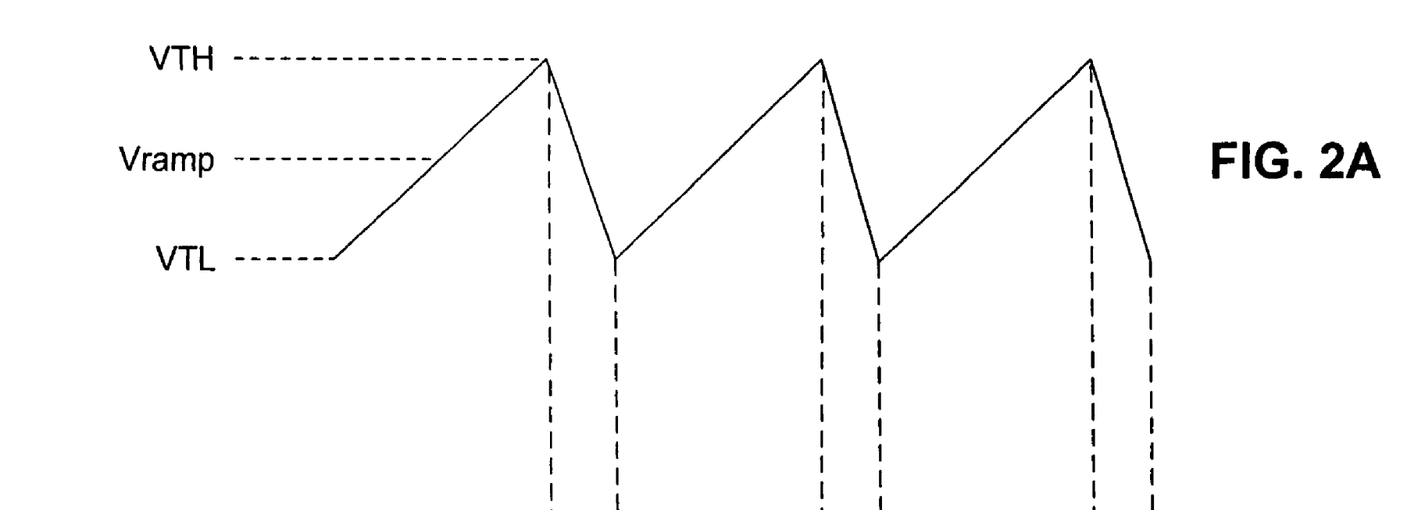
FIGS. 2A and 2B show clock-oscillated signals.
Figure 2B:
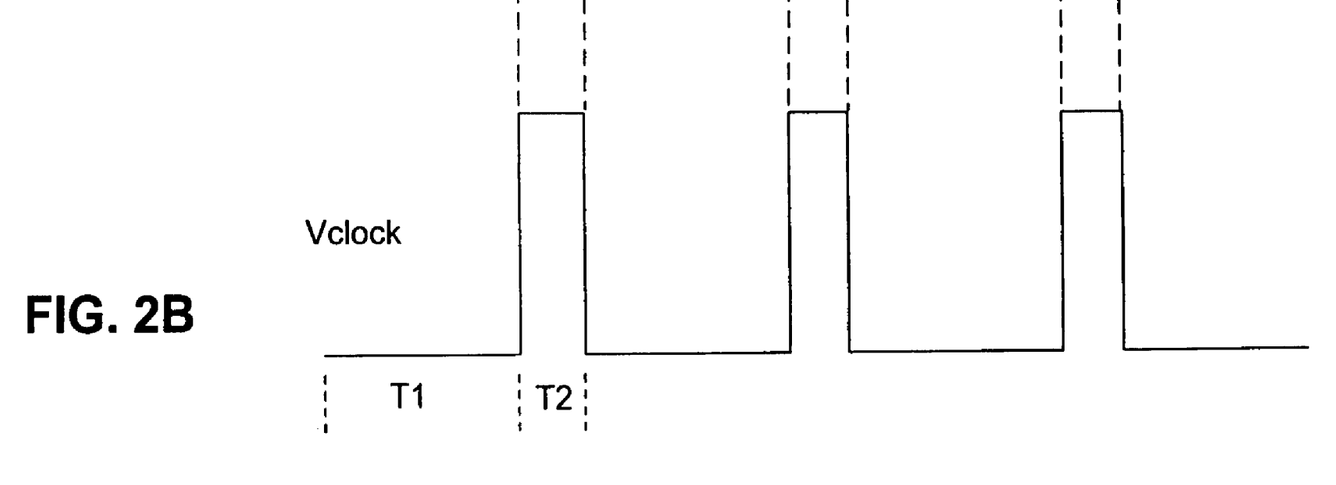

FIGS. 2A and 2B show clock-oscillated signals generated by the clock 102 of PWM system 100 shown in FIG. 1.

Figure 3:
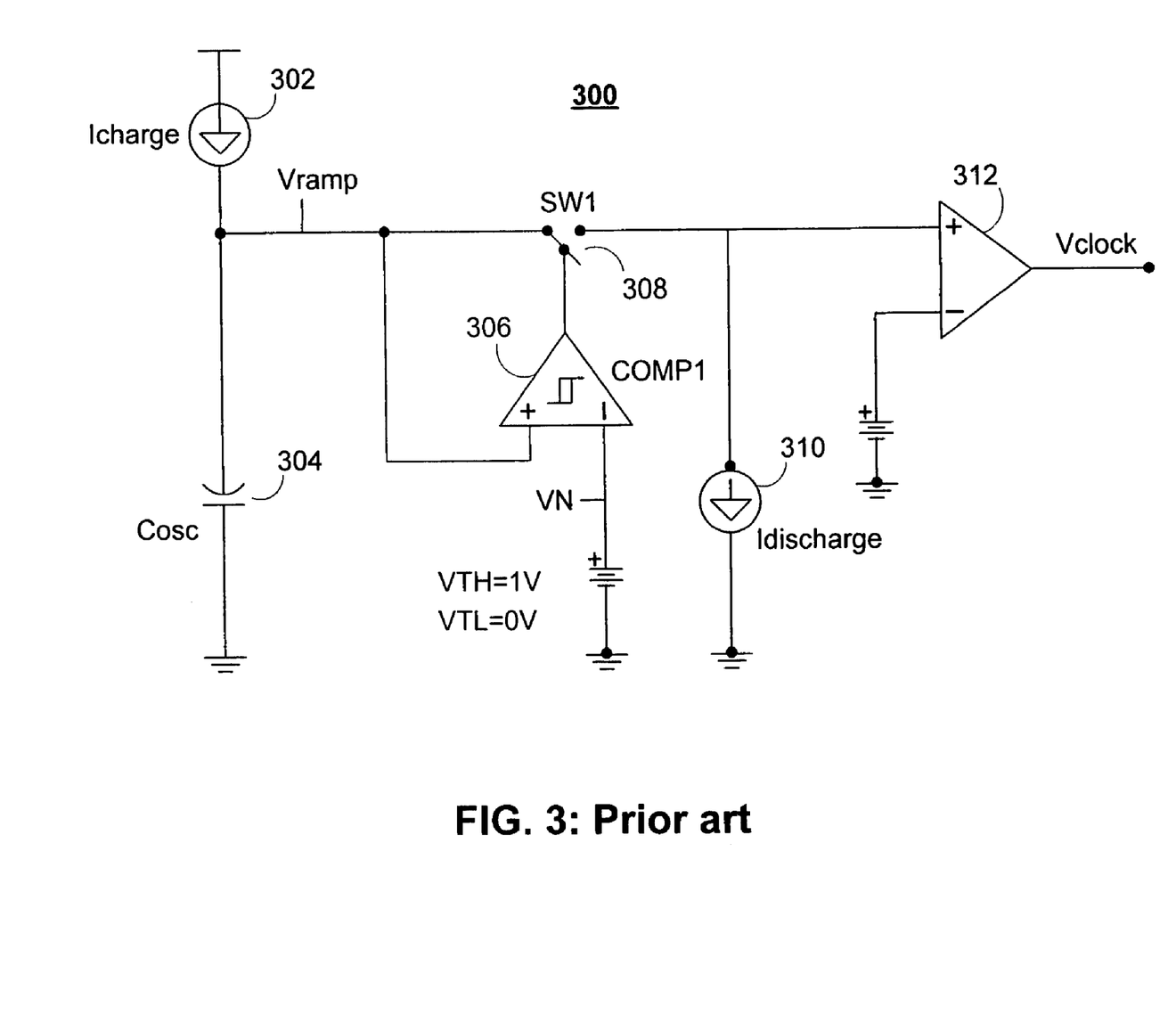
FIG. 3 shows a conventional clock oscillator of the PWM system shown in FIG. 1.

FIG. 3 shows a conventional clock oscillator 300 of the PWM system shown in FIG. 1. Clock oscillator includes a charging current source 302, an oscillating capacitor 304, a first comparator 306, a switch 308, a discharging current sink 310, and a second comparator 312. Also indicated are Vramp and VN (which is compared to Vramp using comparator 306 for opening and closing switch 308).

The most common method of generating constant repeating switching clock cycles for the clock oscillator 300 of the PWM system is by charging oscillator capacitor 304 with a current using charging source 302 until the capacitor voltage is charged up to the preset level VTH (Voltage Threshold High) and resetting the oscillator to VTL (Voltage Threshold Low) after the capacitor reaches VTH.

The clock cycle time T=T1 +T2 as shown in FIG. 2B may be obtained using the following equations:

$$T1 = \frac{Cosc}{(Icharge) \times (VTH)}$$

$$T2 = \frac{Cosc}{(Idischarge) \times (VTH)}$$

Cosc is the capacitance of the oscillator;

Icharge is the charge current;

Idischarge is the discharging current;

VTH is the Voltage Threshold—High; and

VTL is the Voltage Threshold—Low.

Preferably, this oscillator reset process takes a fraction of the total clock cycle time.

In a basic PWM regulator, the switching cycle of the PWM switch 108 begins when switch 308 turns ON at the beginning of T1 (see FIGS. 2A, 2B and 3). The switch-ON duration is determined by the duty cycle which is a function of VIN and VOUT of PWM switching regulator 300, as described above. The switch-ON duration may end at any time during T1. If switch 108 has not been switched OFF by the beginning of T2 and switch 308 is not allowed to turn ON longer than one clock cycle (no cycle skipping) then, switch 308 is typically forced to turn OFF at the beginning of T2 when the oscillator resets.

As the switching frequency increases, each clock cycle becomes so short that it is critical to keep T2 as short as practically possible for high maximum switch duty cycle. In practice, T2 is usually determined by the power transistor switch 108 (see FIG. 1) turn-OFF/ON time.

Typical maximum duty cycle with no cycle skipping ranges from 90% to 95%. When the VIN/VOUT condition of the PWM regulator requires a duty cycle that is higher than the oscillator maximum duty cycle can provide, the output loses regulation. This condition may occur, for example, when a step down converter has a VIN (Input Voltage) that is very close to VOUT (Output Voltage).

In order not to lose output regulation when a higher duty cycle is required, the most common prior art approach is to skip cycles by not turning OFF switch 308 at T2. This method extends the switch-ON time of the PWM longer.

An example of cycle skipping is as follows: a 10 microsecond clock cycle time with OFF time T2 of 1 microsecond and maximum ON time T1 of 9 microsecond gives maximum duty cycle of 90%. If the regulator operation requires a 91% duty cycle, then it follows there will be one non-reset cycle with 10 microseconds ON time for every 9 reset cycles at T2 with 9 microseconds ON time each. This one cycle skip in every 10 cycles on the average has duty cycle of 91%.

One problem with this approach is that it often generates troublesome audible noise because of a low frequency modulation phenomenon associated with the cycle skipping.

Another prior art method uses an open loop comparator approach. The system remains in the oscillator-based constant frequency PWM mode until the OFF time reaches the preset level. To extend the duty cycle, the system then switches to the fixed off time variable frequency mode with no oscillator involved. The disadvantage of this is that a frequency hysteresis is needed to switch back to the other mode when the duty cycle reduces and the abrupt mode change sometimes cause system frequency instability.

It would be desirable to increase the duty cycle of the clock oscillator of a PWM system operating in a voltage regulator without skipping cycles and without abrupt mode changes.

SUMMARY OF THE INVENTION

It is an object of the invention to increase the duty cycle of the clock oscillator of a PWM system operating in a voltage regulator without skipping cycles and without abrupt mode changes.

A method for increasing duty cycle in a pulse-width-modulated voltage regulator is provided. The pulse-width-modulated voltage regulator preferably includes a clock oscillator. The clock oscillator has a capacitor. The oscillator provides a clock signal.

In one embodiment, the method includes using a charging current to charge the capacitor for a charging period of time, using a discharging current to discharge the capacitor for a discharging period of time, and, when desired, extending the charging period of time by diverting a portion of the charging current.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

The preferred embodiment of the invention preferably provides systems and methods for operating the switch at a duty cycle of higher than 90% (or some other suitable, preferably predetermined, duty cycle ratio). The preferred embodiment of the invention can obtain these higher duty cycles in a voltage regulator similar to the exemplary regulator shown in FIG. 1 without cycle skipping. In order to accomplish this, the circuit according to the invention preferably resets every switching cycle, as will be described, and incorporates an analog feedback loop within the clock oscillator system of the PWM system to extend duty cycle time by keeping switch-OFF time constant while increasing switch-ON time.

The circuit sets a reference time of a duration T3, which is preferably slightly longer than T2 and compares the PWM switch OFF time, Toff, with T3. As the VIN/VOUT condition requires a duty cycle higher than 90%, the clock oscillator PWM switch turns ON until it is forced to turn OFF during T2 which is shorter than the reference T3. When the actual OFF time is preferably less than T3, an analog feedback loop closes as follows.

The analog feedback loop preferably includes a high-gain negative feedback amplifier that forces the switch OFF time, Toff, of the PWM switch to be the same time duration as the reference T3 by reducing the oscillator charging current Icharge. This extends the total time of the duty cycle. In response to the switch-OFF time being fixed at T3, the invention preferably adjusts the clock cycle time by increasing the T1 of the clock cycle. This allows for an increase in the PWM switch ON time which can then provide the required duty cycle.

Figure 4:
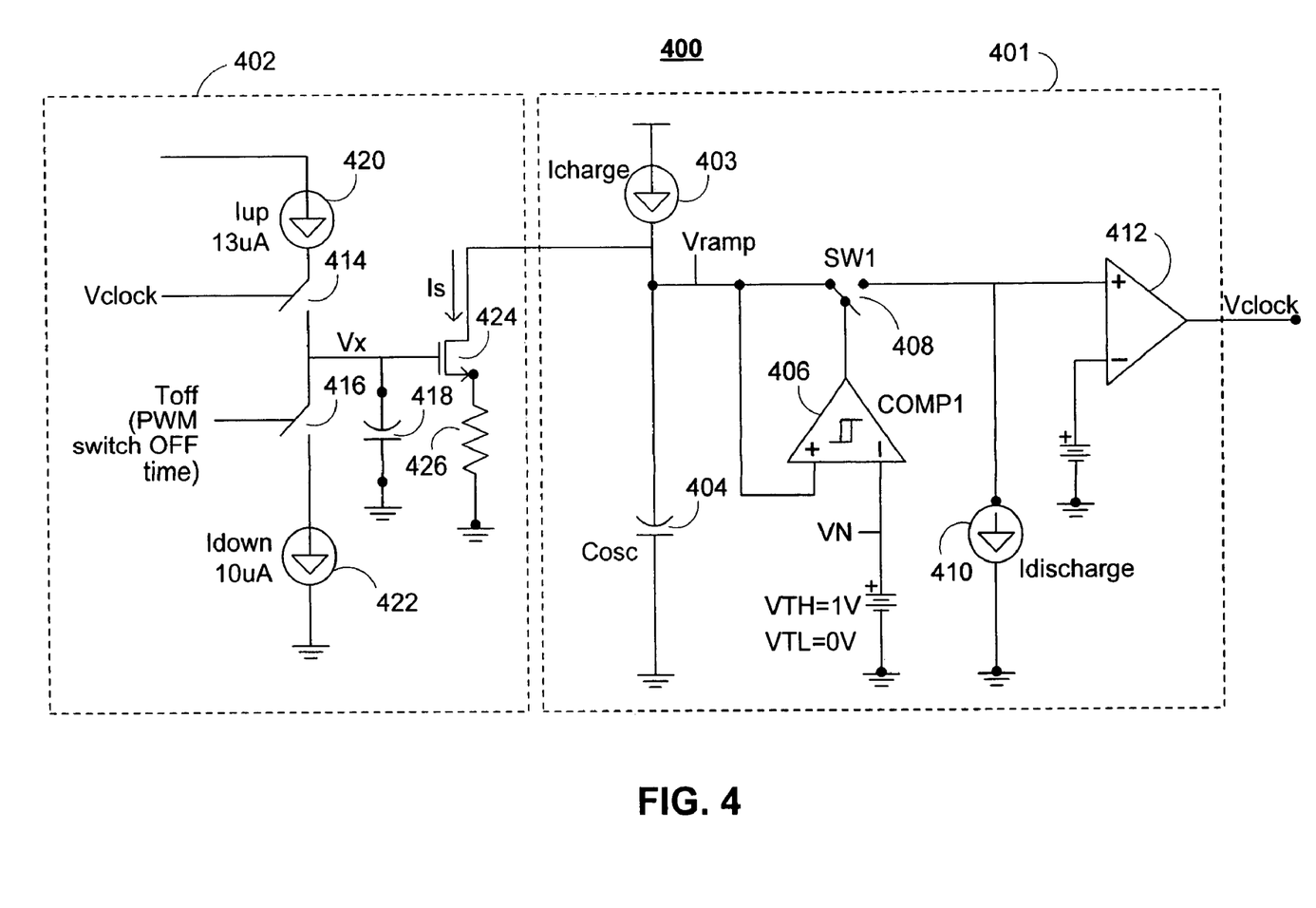
FIG. 4 a schematic diagram of one embodiment of a clock oscillator system according to the invention.

FIG. 4-8 show the invention in detail. FIG. 4 shows a schematic diagram of one embodiment of a clock oscillator system 400 including an oscillator circuit 401 and loop amplifier circuit 402 according to the invention. Oscillator circuit 401 corresponds to oscillator 300 shown in FIG. 3. Amplifier 402 preferably includes switches 414 and 416, which switch ON (close) and switch OFF (open) in response to signals received from Vclock and Toff (PWM switch OFF time), respectively, amplifier capacitor 418, current sources 420 and 422, transistor 424, and resistor 426. Resistor 426 preferably adjusts the amount of current that transistor 424 conducts.

In operation, amplifier 402 of the circuit according to the invention is implemented as a charge pump charging amplifier capacitor 418 which serves as the loop filter for loop response speed control by amplifier 402 of oscillator circuit 400. During switch 414 ON time, Iup (from current source 420) flows into amplifier capacitor 418 to charge amplifier capacitor 418. During switch 416 ON time, Idown flows out of amplifier capacitor 418 to discharge amplifier capacitor 418.

The Up charge=(Iup)×(switch 414 ON time)

The Down charge=(Idown)×(switch 416 ON time)

Vx (voltage potential associated with amplifier capacitor 418) rises preferably only when the up charge is higher than the down charge. And when Vx rises to above transistor 424 turn-ON threshold, transistor 424 then starts conducting and takes the oscillator capacitor charging current Icharge (provided by source 403) away from oscillator capacitor 404. This extends the clock cycle ON time, Tb1. The clock cycle ON time extension is illustrated in greater detail in the following example.

The following is one example of how amplifier 401 extends clock cycle ON time, and, thereby, can increase the effective duty cycle without cycle skipping:

Let Idown=10 uA and Iup=13 uA.

Switch 414 is controlled by Vclock as shown coming out from comparator 412. In this particular embodiment Vclock provides a T1 period and a constant T2 of 1 microsecond.

Switch 416 is controlled by the PWM system switch OFF time Toff.

Vx remains low when Toff is longer then 1.3 microsecond. This condition corresponds to an 87% duty cycle or lower in a 10 microsecond total clock cycle.

When the system requires duty cycle higher than 87%, Toff will be pushed shorter than 1.3 microseconds. Under this condition the Up charge is more than the Down charge and Vx will rise to turn transistor 424 ON and the loop closes to take Icharge, which charges oscillator capacitor 404, away from oscillator circuit 401.

When Icharge is diverted into amplifier 402, the clock cycle ON time, T1, is extended to satisfy the longer duty cycle required by the PWM system and the Toff is forced back up to 1.3 microseconds by the negative feedback amplifier. It should be noted that the clock cycle ON time, T1, is extended without extending the clock cycle OFF time, T2, thereby effectively allowing the PWM to have a higher duty cycle. When this analog feedback amplifier loops around the pulsewidth-modulated system, the pulse-width-modulated system automatically adjusts the amount of the cycle extension time.

By extending the cycle time this way, a very high PWM duty cycle can be achieved with no low frequency intermodulation associated with the cycle skipping prior art approach. Furthermore, with this analog feedback loop approach the duty cycle extension process is smooth, and also transparent to the PWM loop because only the oscillator cycle time is changed.

Furthermore, this analog-feedback-loop-controlled approach is preferably always oscillator-controlled switching with no abrupt or sudden mode change as in the case of one of the prior art approaches.

The invention circuit can also be modified to fix the PWM switch-ON time while extending the duty cycle time. This approach preferably achieves a fixed frequency (no cycle skipping) very low duty cycle PWM operation to avoid similar cycle-skipping audible noise—e.g., when cycles are skipped and the voltage regulator does not turn ON such as in light output load conditions.

Figure 5:
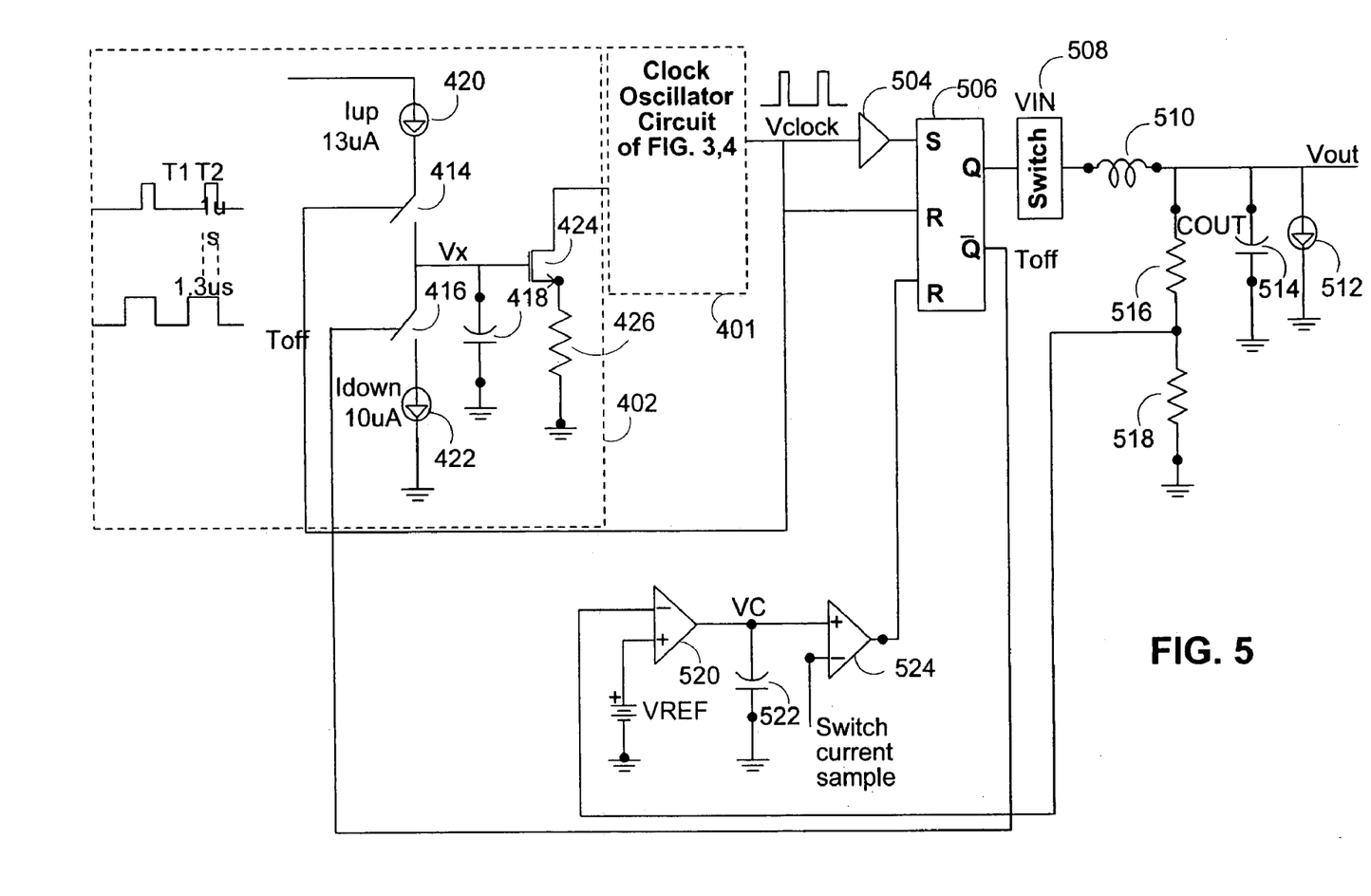
FIG. 5 a schematic diagram of a switching regulator system according to the invention.

FIG. 5 shows a schematic diagram of a switching regulator system 500 that incorporates the circuit according to the invention for at least the purpose of extending the ON duty cycle of the PWM. It should be noted that the circuit shown in FIG. 5 may preferably implements oscillator circuit 401 and the amplifier 401 of FIG. 4 in a voltage regulator such as the conventional regulator 100 shown in FIG. 1. Therefore, elements 504, 506, 508, 510, 512, 514, 516, 518, 520, 522, and 524 are similar to the corresponding elements in FIG. 1. It should be noted as well that Toff is derived from the inverse of the PWM switch ON signal.

Figure 6:
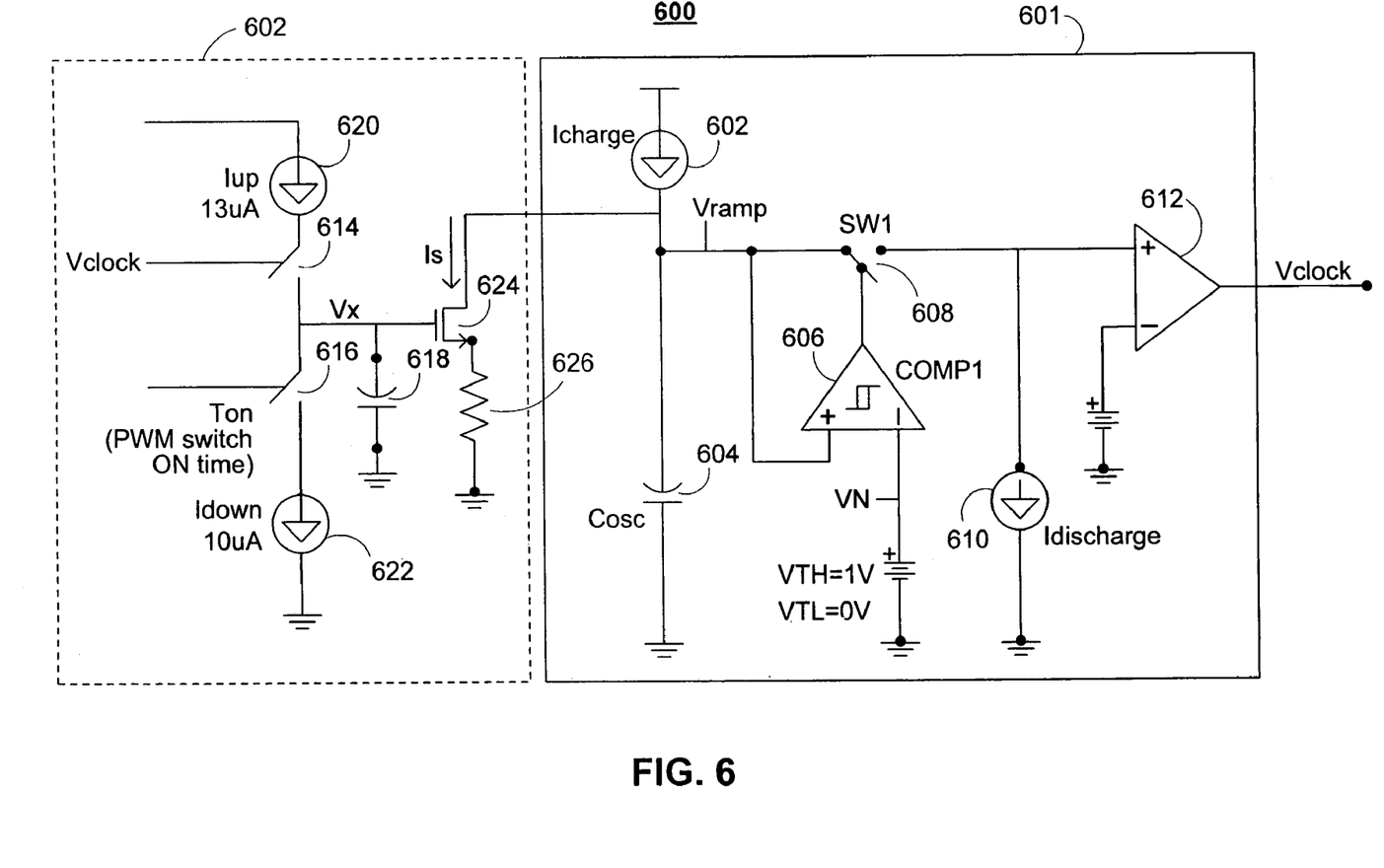
FIG. 6 is a schematic diagram of an amplifier circuit according to the invention.

FIG. 6 is a schematic diagram of an amplifier circuit 602 according to the invention that is used for duty cycle reduction. In this particular embodiment, each of the elements 601, 602, 603, 604, 608, 610, 612, 614, 616, 618, 620, 622, 624, and 626 all preferably correspond to the similar elements shown in FIG. 4. Nevertheless, duty cycle reduction is preferably obtained by comparing Vclock with the PWM switch-ON time at switches 614 and 616, respectively, instead of PWM switch-OFF time. In this embodiment, amplifier 602 preferably maintains the PWM switch-ON time (instead of the switch-OFF time) at 1.3 microseconds (or other suitable time period). By limiting PWM switch-ON time in this fashion, the duty cycle is reduced and can be maintained at a relatively low level.

Figure 7:
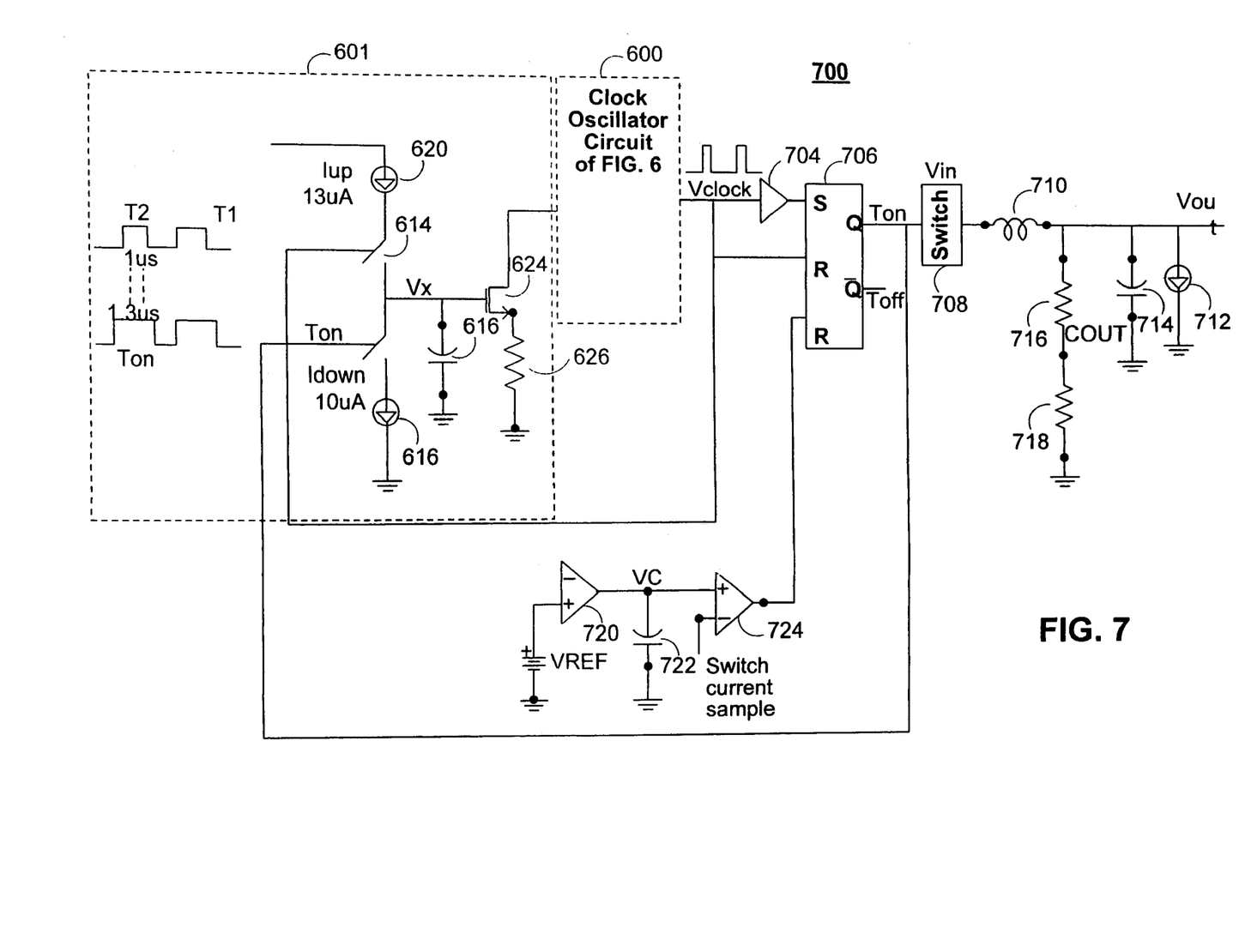
FIG. 7 a schematic diagram of another switching regulator system according to the invention.

FIG. 7 shows a schematic diagram of a switching regulator system 700 that incorporates the invention circuit to achieve lower duty cycle (reduce the ON duty cycle of the PWM regulator). Switching regulator system 700 incorporates oscillator 600 and amplifier 601 according to the invention in a way that limits the ON duty cycle of the PWM. It should be noted that the circuit shown in FIG. 7 preferably combines the conventional regulator shown in FIG. 1 with the clock oscillator 600 and the amplifier 601 of FIG. 6.

The circuit in FIG. 7 operates as follows:

Let Idown=10 uA and Iup=13 uA.

Switch 614 is controlled by Vclock as shown coming out from comparator 612 (shown in FIG. 6). In this particular embodiment Vclock provides a T1 period and a constant T2 of 1 microsecond.

Switch 616 is controlled by the PWM system switch ON time Ton.

Vx remains low when Ton is longer then 1.3 microsecond. This condition corresponds to any duty cycle except a relatively small duty cycle.

When the system requires such a relatively low duty cycle, Ton will be pushed shorter than 1.3 microseconds. Under this condition the Up charge is more than the Down charge and Vx will rise to turn transistor 624 ON and the loop closes to take Icharge, which charges oscillator capacitor 604 (not shown in FIG. 7), away from oscillator circuit 600.

When Icharge is diverted into amplifier 601, the clock cycle ON time, T1, is extended. By extending the clock cycle ON time, which extends the total clock cycle time, while maintaining the PWM only requests a short switch ON time, the duty cycle is effectively reduced.

Figure 8:
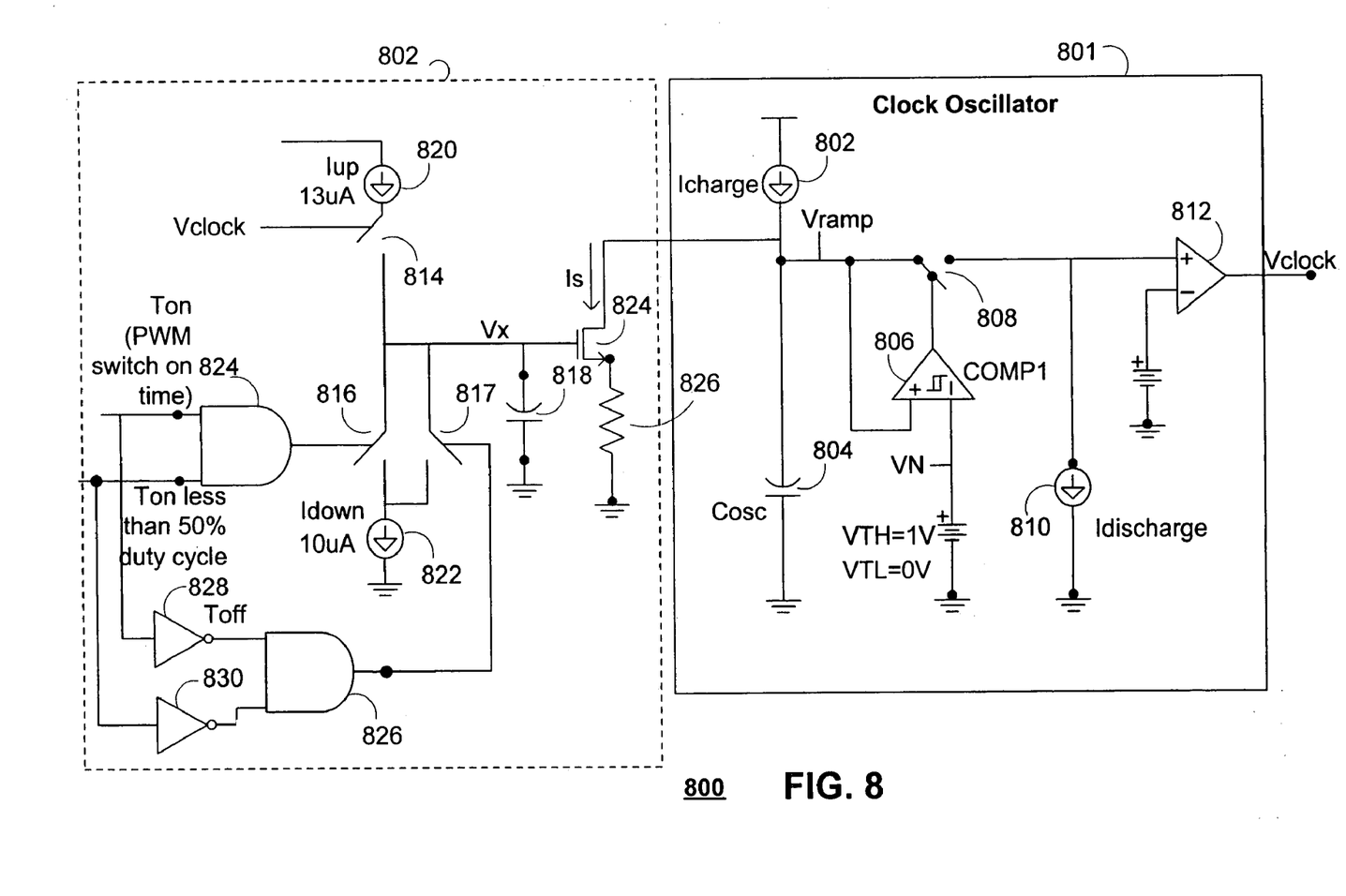
FIG. 8 yet another schematic diagram of a switching regulator system according to the invention.

FIG. 8 is a schematic diagram of a clock oscillator system 800 for both duty cycle extension and reduction. The circuit includes clock oscillator 801 and amplifier 802. Elements 801, 802, 804, 806, 808, 810, 812, 814, 818, 820, 824 and 826 are essentially the same as the corresponding elements shown in FIGS. 4 and 6. The additional functionality of FIG. 8 is added by additional logic and an additional switch 817. Additional logic includes AND gates 824 and 826 as well as inverters 828 and 830.

The additional circuitry in FIG. 8 operates as follows. Switch 816 is preferably controlled by the PWM switch ON time Ton and switch 817 is preferably controlled by the PWM switch OFF time Toff (through inverter 828). When the duty cycle is higher than 50%, AND gate 826 allows switch 817 to turn ON and AND gate 824 disables switch 816 for duty cycle extension. Duty cycle extension is obtained because the operation of amplifier 801 is balanced using the switch OFF time of the PWM switch (not shown) similar to the circuit shown in FIG. 5.

On the other hand when the duty cycle is less than 50% (or any other suitable duty cycle), AND gate 826 disables switch 817 and AND gate 824 turns switch 816. Duty cycle reduction is obtained because the operation of amplifier 802 is balanced using the switch ON time of the PWM switch (not shown) similar to the circuit shown in FIG. 7.

It will be understood, therefore, that the foregoing is only illustrative of the principles of the invention, and that various modifications can be made by those skilled in the art without departing from the scope and spirit of the invention, and the present invention is limited only by the claims that follow.

What is claimed is:

1. A clock oscillator system that provides a clock signal to control operation of a switching regulator, the clock oscillator system comprising:
    an oscillator circuit comprising:
        a capacitor;
        a current source that uses a charging current for a charging period of time to charge the capacitor; and
        a current sink that uses a discharging current for a discharging period of time to discharge the capacitor; and
    an amplifier circuit that extends the charging period of time by diverting a portion of the charging current to control a switch of the switching regulator so as to increase a duty cycle of the switching regulator at the duty cycle exceeding 50%.

2. The clock oscillator system of claim 1 wherein the clock oscillator system maintains the discharging period of time constant independent of whether the amplifier circuit extends the charging period of time.

3. The clock oscillator system of claim 1 wherein the clock oscillator system provides a clock signal for a pulse-width modulated switching regulator.

4. A clock oscillator system that provides a clock signal, the clock oscillator system comprising:

an oscillator circuit comprising:
   a capacitor; a current source that uses a charging current for a charging period of time to charge the capacitor; and
   a current sink that uses a discharging current for a discharging period of time to discharge the capacitor; and
an amplifier circuit that extends the charging period of time by diverting a portion of the charging current,
wherein the clock oscillator system provides a clock signal for a pulse-width modulated switching regulator and
the amplifier further comprises a switch responsive to the switch-OFF time of the pulse-width modulated switching regulator.

5. The clock oscillator system of claim 1 wherein the amplifier further comprises an input from an output of the oscillator circuit.

6. A clock oscillator system that provides a clock signal for a switching voltage regulator, the clock oscillator system comprising:
   an oscillator circuit comprising:
      a capacitor;
      a current source that uses a charging current for a charging period of time to charge the capacitor;
      a current sink that uses a discharging current for a discharging period of time to discharge the capacitor; and
   an amplifier circuit that reduces a duty cycle of the switching voltage regulator by diverting a portion of the charging current.

7. The clock oscillator system of claim 6 wherein the clock oscillator system maintains the discharging period of time constant independent of whether the amplifier circuit reduces the charging period of time.

8. The clock oscillator system of claim 6 wherein the clock oscillator system provides a clock signal for a pulse-width modulated switching regulator.

9. The clock oscillator system of claim 8 wherein the amplifier further comprises a switch responsive to the switch-ON time of the pulse-width modulated switching regulator.

10. The clock oscillator system of claim 6 wherein the amplifier further comprises an input from an output of the oscillator circuit.

11. A method for increasing duty cycle in a pulse-width-modulated voltage regulator, the pulse-width-modulated voltage regulator including a clock oscillator having a capacitor, the oscillator being configured for providing a clock signal to operate the voltage regulator, the method comprising:
   using a charging current to charge the capacitor for a charging period of time;
   using a discharging current to discharge the capacitor for a discharging period of time; and
   extending the charging period of time by diverting a portion of the charging current to control a switch of the voltage regulator so as to increase the duty cycle of the voltage regulator at the duty cycle exceeding 50%.

12. The method of claim 11 further comprising maintaining the discharging period of time constant independent of whether the amplifier circuit extends the charging period of time.

13. The method of claim 11 further comprising using the clock oscillator to provide a clock signal for the pulse-width-modulated switching regulator.

14. A method for increasing duty cycle in a pulse-width-modulated voltage regulator, the pulse-width-modulated voltage regulator including a clock oscillator having a capacitor, the oscillator that provides a clock signal, the method comprising:
   using a charging current to charge the capacitor for a charging period of time;
   using a discharging current to discharge the capacitor for a discharging period of time;
   extending the charging period of time by diverting a portion of the charging current;
   using the clock oscillator to provide a clock signal for the pulse-width-modulated switching regulator; and
   causing the clock oscillator to be responsive to the switch-OFF time of the pulse-width modulated switching regulator.

15. The method of claim 11 further comprising using an output of the clock oscillator system as an input to the clock oscillator system.

16. A method for decreasing duty cycle in a pulse-width-modulated voltage regulator, the pulse-width-modulated voltage regulator including a clock oscillator having a capacitor, the oscillator that provides a clock signal, the method comprising:
   using a charging current to charge the capacitor for a charging period of time;
   using a discharging current to discharge the capacitor for a discharging period of time; and
   increasing the charging period of time by diverting a portion of the charging current, the increasing the charging period of time that reduces the duty cycle of the pulse-width-modulated voltage regulator.

17. The method of claim 16 further comprising maintaining the discharging period of time constant independent of whether the amplifier circuit extends the charging period of time.

18. The method of claim 16 further comprising using the clock oscillator to provide a clock signal for the pulse-width-modulated switching regulator.

19. The method of claim 18 further comprising causing the clock oscillator to be responsive to the switch-ON time of the pulse-width modulated switching regulator.

20. The method of claim 16 further comprising using an output of the clock oscillator system as an input to the clock oscillator system.

* * * * *